(12) United States Patent  (10) Patent No.: US 7,595,699 B1
Schlueter et al.  (45) Date of Patent: Sep. 29, 2009

(54) LOOK LOOP CIRCUIT AND METHOD HAVING IMPROVED LOCK TIME

(75) Inventors: David M. Schlueter, Lake Villa, IL (US); Michael C. Doll, Gurnee, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 16 days.

(21) Appl. No.: 12/042,228

(22) Filed: Mar. 4, 2008

(51) Int. Cl.
 *H03L 7/10* (2006.01)
(52) U.S. Cl. .......................... 331/17; 331/25; 455/260
(58) Field of Classification Search ............... 331/1 A, 331/8, 14, 16–18, 25; 455/260
 See application file for complete search history.

(56) References Cited

U.S. PATENT DOCUMENTS

| 5,874,863 | A | 2/1999 | Wojewoda et al. |
| 5,889,829 | A | 3/1999 | Chiao et al. |
| 6,667,642 | B1 | 12/2003 | Moyal |
| 6,731,146 | B1 | 5/2004 | Gallardo |
| 7,199,673 | B2 | 4/2007 | Erdogan |
| 2005/0277397 | A1* | 12/2005 | Christoffers et al. ........ 455/255 |

* cited by examiner

*Primary Examiner*—David Mis
(74) *Attorney, Agent, or Firm*—Vedder Price P.C.

(57) ABSTRACT

A lock loop circuit (230) includes a floating ground loop filter circuit (302) and a precharge circuit (304). The floating ground loop filter circuit includes at least one capacitive element (326, 328). The floating ground loop filter circuit provides a steering signal (334) for a controllable oscillator circuit (306) in response to a precharge signal (347). The precharge circuit provides the precharge signal in response to lock loop enable information (226). The precharge circuit controls the floating ground loop filter to bypass the at least one capacitive element for a period of time (606) in response to the lock loop enable information.

20 Claims, 6 Drawing Sheets

FIG. 1 –PRIOR ART–

LOOK LOOP CIRCUIT AND METHOD HAVING IMPROVED LOCK TIME

CROSS-REFERENCE TO RELATED APPLICATION

This application is related to co-pending application entitled "AUTOMATIC CALIBRATION LOCK LOOP CIRCUIT AND METHOD HAVING IMPROVED LOCK TIME," filed on even date, having Ser. No. 12/042,216, inventors David M. Schlueter and Michael C. Doll, owned by instant Assignee and is incorporated herein by reference in its entirety.

BACKGROUND

1. Field

The present disclosure generally relates to lock loop circuits, and more particularly, to lock loop circuits having a reduced time required to lock frequency and phase.

2. Related Art

Lock loop circuits such as phase lock loop (PLL) circuits provide an output signal having a frequency and phase that is locked to a reference signal. More specifically, PLL circuits use feedback to adjust the output signal so that the frequency and phase of the output signal match the reference signal.

As known in the art, PLL circuits are used in many applications such as radio, telecommunications, computers, and other suitable applications. For example, the circuits can be used to, among other things, generate stable frequencies, recover signals from noisy communication signals, and provide clock timing for applications requiring a stable clock.

Some mobile devices include power management systems that disable phase lock loop circuits when not in use in order to reduce power consumption and increase battery life. Since PLL circuits are used for timing in many devices, it is desirable for the circuit to quickly lock frequency and phase when the power management system re-enables the circuit.

As shown in FIG. 1, a typical PLL circuit 100 includes an error detector 102, a loop filter 104, a voltage controlled oscillator (VCO) 106, and a feedback divider 108. The loop filter 104 includes a resistor 110, a first capacitor 112, and a second capacitor 114. The resistor 110 is operatively coupled to the error detector 102 and the VCO 106 at one end and the first capacitor 112 at the other end. The first capacitor 112 is operatively coupled to the resistor 110 at one end and to ground 116 at the other end. The second capacitor 114 is operatively coupled to the error detector 102 and the VCO 106 at one end and ground 116 at the other end.

During operation, the error detector 102 provides an unfiltered VCO control voltage 116 in response to a reference frequency signal 118 and feedback frequency signal 120. More specifically, the error detector 102 adjusts the unfiltered VCO control voltage 116 to reduce a frequency and phase difference between the reference frequency signal 118 and the feedback frequency signal 120.

The loop filter 104 filters the unfiltered VCO control voltage 116 to remove any imperfections and provides a VCO control voltage 122 (e.g., a steering voltage) based thereon. The VCO 106 provides an output frequency signal 124 in response to the VCO control voltage 122. The feedback divider 108 provides the feedback frequency signal 120 in response to the output frequency signal 124.

In some embodiments, the PLL circuit 100 includes a loop precharger 126 to reduce time required for the PLL circuit 100 to lock frequency and phase. In response to a PLL enable signal 128, the loop precharger 108 provides the unfiltered VCO control voltage 116, which precharges the first and second capacitors 112, 114. In this manner, the VCO control voltage signal 122 is adjusted to a desired value faster than PLL circuits without the loop precharger 126.

Although the loop precharger 126 reduces time for the PLL circuit 100 to lock the frequency and phase of the output frequency signal 124, it is desirable to further reduce the time required to lock the frequency and phase.

In addition, the first and second capacitors 112, 114 are known to leak current to ground, which increases power consumption and noise of the PLL circuit 100. Therefore, it desirable to provide a PLL circuit having a loop filter with reduced current leakage to ground.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
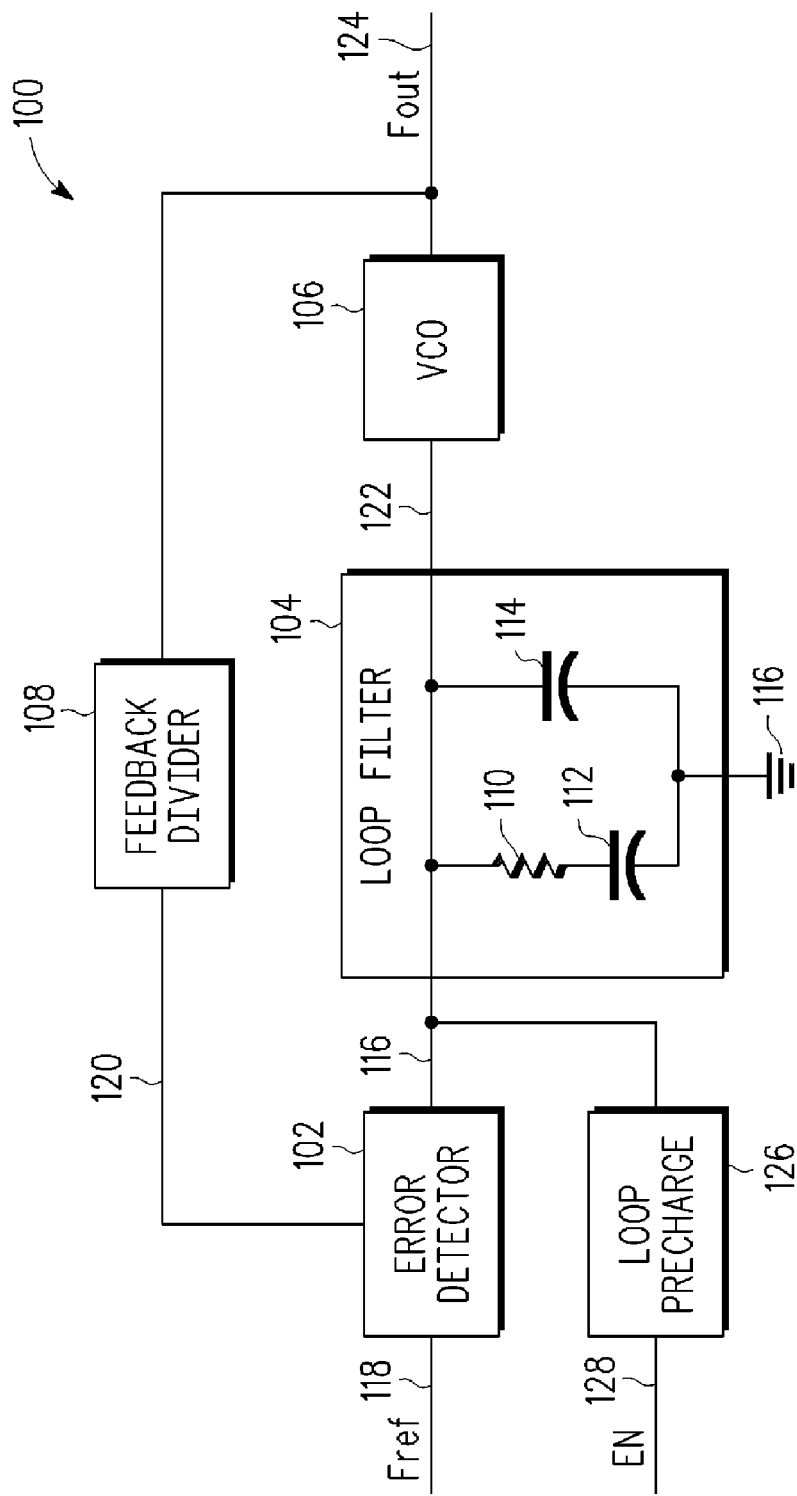
FIG. 1 is an exemplary block diagram of a prior art lock loop circuit.

In one example, a lock loop circuit includes a floating ground loop filter circuit and a precharge circuit. The floating ground loop filter circuit includes at least one capacitive element. The floating ground loop filter circuit provides a steering signal for a controllable oscillator circuit in response to a precharge signal. The precharge circuit provides the precharge signal in response to lock loop enable information. The precharge circuit controls the floating ground loop filter to bypass the capacitive element for a period of time in response to the lock loop enable information. A related method is also disclosed.

The circuit and method provide, among other advantages, an output signal having a frequency and phase that is locked to a reference signal faster than conventional lock loop circuits and methods. In addition, the floating loop ground filter reduces leakage current to ground, which reduces power consumption and noise of the lock loop circuit. Other advantages will be recognized by those of ordinary skill in the art.

In one example, the lock loop circuit includes a synchronized feedback divider circuit. After a second period of time, the synchronized feedback divider circuit provides feedback frequency information based on output frequency information provided by the controllable oscillator circuit in response to the steering signal. In one example, the feedback frequency information is provided in response to a rising edge of reference frequency information. In one example, the second period of time is greater than the period of time.

In one example, the floating ground loop filter circuit includes at least one bypass switch circuit operatively coupled in parallel to the capacitive element. The bypass switch circuit bypasses the capacitive element in response to a bypass control signal received from the precharge circuit.

In one example, the lock loop circuit includes an error detection circuit. The error detection circuit provides an unfiltered steering signal based on the frequency feedback information and the reference frequency information.

In one example, the precharge circuit includes a first delay circuit, a second delay circuit, a third delay circuit, and a voltage regulator circuit. After a third period of time that is less than the period of time, the first delay circuit provides a voltage regulator enable signal in response to the lock loop enable information. In response to the lock loop enable information, the second delay circuit enables the floating ground loop filter to bypass the capacitive element for the period of time. After the second period of time, the third delay circuit enables the synchronized feedback divider. The voltage regulator circuit provides the precharge signal in response to the voltage regulator enable signal.

In one example, a mobile device (e.g., a wireless phone, a mobile computer, a media player, and/or any other suitable mobile device that is operative by a battery) includes a battery supply circuit, a switching converter circuit, and the lock loop circuit. The battery supply circuit provides a first voltage value. The switching converter circuit, which includes at least one switching element, converts the first voltage value into a second voltage value. The lock loop circuit provides a switching control signal to the switching element in response to the steering signal.

As used herein, the term "circuit" can include one or more processors (e.g., shared, dedicated, or group of processors such as but not limited to microprocessors, DSPs, or central processing units) and memory that execute one or more software or firmware programs, electronic circuits, integrated circuits, combinational logic circuits, FPGAs, ASICs, state machines, and/or other suitable components that provide the described functionality. In addition, the term "signal" may refer to analog or digital information.

Figure 2:
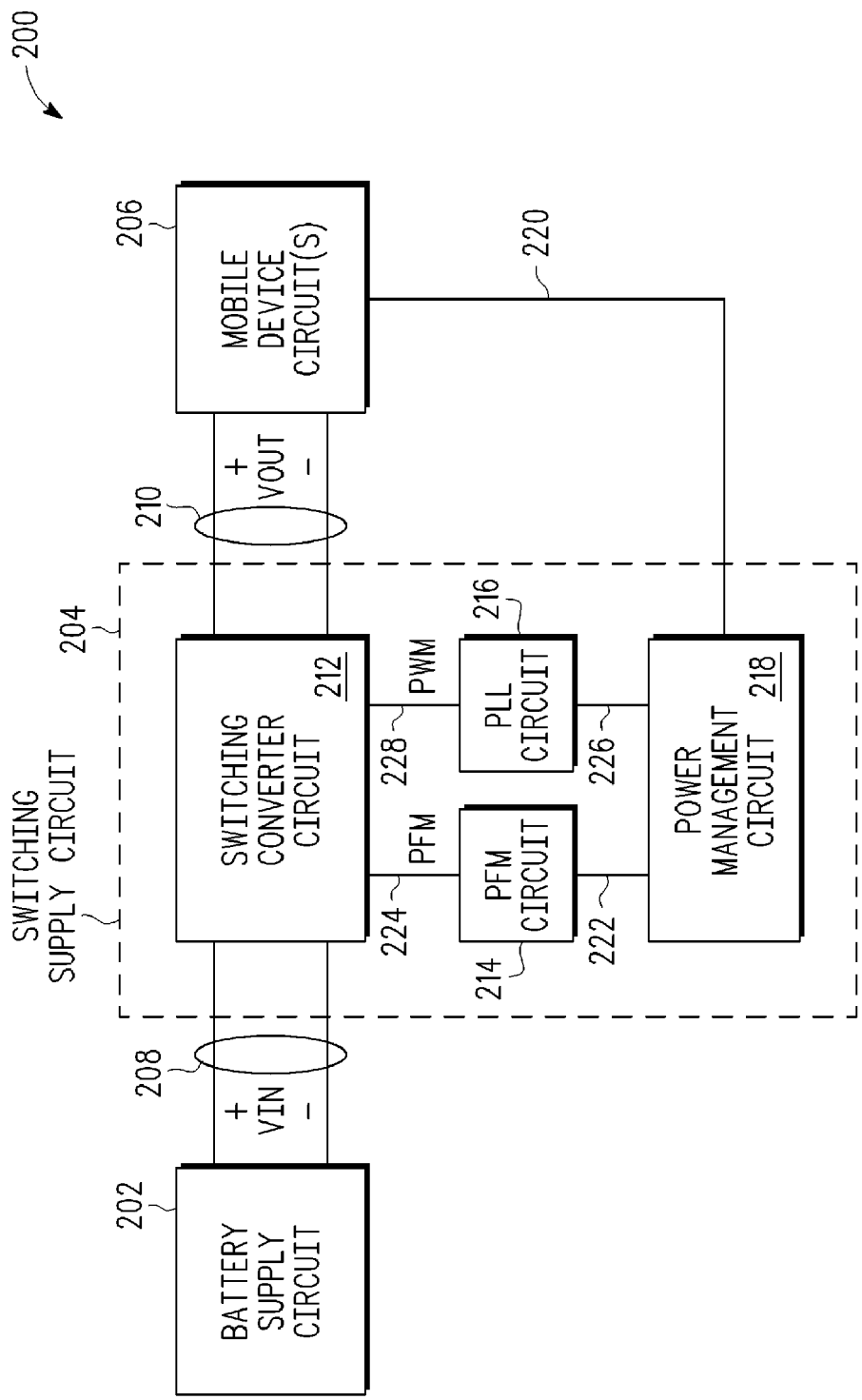
FIG. 2 is an exemplary block diagram of a mobile device using a reduced lock time lock loop circuit in accordance with one embodiment of the present disclosure.

Referring now to FIG. 2, an exemplary functional block diagram of a mobile device 200 such as a wireless phone, a mobile computer, a media player, or any other suitable mobile device that is operative by a battery supply circuit 202. The mobile device includes a switching power supply circuit 204 and other mobile device circuits 206 required to provide the desired functionality of the mobile device 200. The switching power supply circuit 204 receives a battery supply voltage 208 and provides a suitable supply voltage 210 to the other mobile device circuits 206. In some embodiments, the switching power supply circuit 204 can be a buck switching supply circuit to convert the suitable supply voltage 210 to a lower voltage value than the battery supply voltage 208. In other embodiments, the switching power supply circuit 204 can be a boost switching supply circuit to convert the suitable supply voltage 210 to a higher voltage value than the battery supply voltage 208.

The switching power supply circuit 204 includes a switching converter circuit 212, a pulse frequency modulation (PFM) circuit 214, a lock loop circuit 216 such as a phase lock loop (PLL) circuit having a reduced lock time, and a power management circuit 218. Although the lock loop circuit 216 is discussed as a phase lock loop (PLL) circuit herein, skilled artisans will appreciate that the lock loop circuit 216 can be implemented as any other suitable lock loop circuit such as, for example, a delay lock loop circuit. The power management circuit 218 monitors a load 220 of the mobile device circuits 206 and determines whether to operate the switching converter circuit 212 in a PFM mode or a pulse width modulation (PWM) mode based on the load 220. In some embodiments, the power management circuit 218 provides a PFM enable signal 222 when the load is operating in at light load condition such as, for example, less than or equal to 50 mA. In response to the PFM enable signal 222, the PFM circuit 214 provides a PFM control signal 224 to the switching converter circuit 212, which controls internal switching of the circuit as known in the art.

In addition, in some embodiments, the power management circuit 218 provides a lock loop enable signal 226 when the load is operating at a load greater than the light load (e.g., greater than or equal to 50 mA) so that the switching converter circuit 212 can operate in the PWM mode. In response to the lock loop enable signal 226, the lock loop circuit 216 provides a control signal 228 (e.g., a PWM control signal) having a stable frequency and phase to the switching converter circuit 212, which controls internal switching of the circuit as known in the art. As will be discussed in more detail, the lock loop circuit 216 requires less time to lock frequency and phase than known lock loop circuits. As such, the lock loop circuit 216 can provide the control signal 228 having a stable frequency and phase faster than known PLL circuits.

Although, the reduced lock time lock loop circuit 216 is used to control switching of a switching converter circuit in this example, skilled artisans will appreciate that the lock loop circuit 216 can be used in any application where a signal having a stable frequency and phase is desired.

Figure 3:
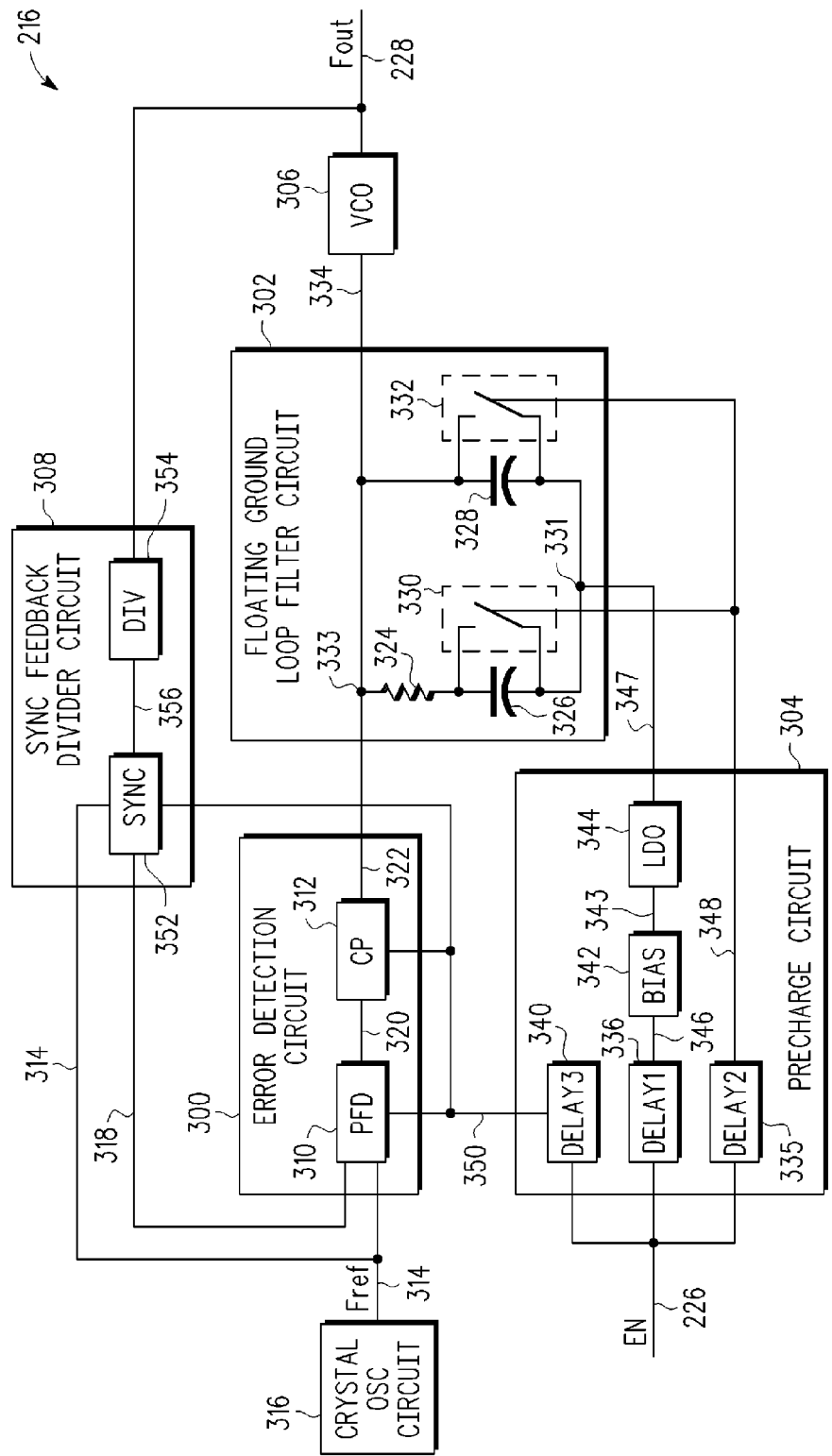
FIG. 3 is an exemplary block diagram of the reduced lock time lock loop circuit.

Referring now to FIG. 3, the lock loop circuit 216 includes an error detection circuit 300, a floating ground loop filter circuit 302, a precharge circuit 304, a controllable oscillator circuit 306, and a synchronized feedback divider circuit 308. The error detection circuit 300 is operatively coupled to the floating ground loop filter circuit 302, the synchronized feedback divider circuit 308, and the precharge circuit 304. The controllable oscillator circuit 306 is operatively coupled to the synchronized feedback divider circuit 308 and the floating ground loop filter circuit 302. The floating ground loop filter circuit 302 is operatively coupled to the error detection circuit 300, the controllable oscillator circuit 306, and the precharge circuit 304. As shown, the floating ground loop filter circuit 302 is not coupled to ground 116 like the loop filter 104 depicted in FIG. 1. Therefore, the floating ground loop filter circuit 302 has a floating (or virtual) ground unlike the loop filter 104 in FIG. 1.

The error detection circuit 300 includes a phase-frequency detection (PFD) circuit 310 and a charge pump circuit 312. The PFD circuit 310 compares a reference frequency signal 314, which can be provided by a crystal oscillator circuit 316 for example, to a feedback frequency signal 318. The PFD circuit 310 provides error information 320 based on a difference (e.g., frequency and phase difference) between the reference frequency signal 314 and the feedback frequency signal 318. The charge pump circuit 312 provides a unfiltered steering signal 322 in response to the error information 320. In some embodiments, the unfiltered steering signal 322 is proportional to the error information 320.

The floating ground loop filter circuit 302 includes a resistive element 324 (e.g., a resistor), a first capacitive element 326 (e.g., a capacitor), a second capacitive element 328 (e.g., a capacitor), a first bypass switch circuit 330, and a second bypass switch circuit 332. The resistive element 324 and the first capacitive element 326 are operatively coupled in series between node 331 and node 333. The second capacitive element 328 is operatively coupled in parallel to the resistive element 324 and the first capacitive element 326. The first bypass switch circuit 330 is operatively coupled in parallel to the first capacitive element 326. The second bypass switch circuit 332 is operatively coupled in parallel to the second capacitive element 328.

The precharge circuit 304 selectively controls the bypass switch circuits 330, 332 to bypass the respective capacitive element 326, 328 in order to provide a steering signal 334 faster than known PLL circuits 100. More specifically, the precharge circuit 304 provides a precharge signal 347 and controls the floating ground loop filter 302 to bypass the capacitive elements 326, 328 in response to the enable signal 226. In response to the precharge signal 347, the floating ground loop filter circuit 302 provides a steering signal 334 (e.g., an oscillator control signal) for the controllable oscillator circuit 306.

The precharge circuit 304 includes a first delay circuit 336, a second delay circuit 338, a third delay circuit 340, a bias circuit 342, and a voltage regulator circuit 344. The bias circuit 342 provides a bias signal 343 (e.g., a bias current) to the voltage regulator circuit 344 as known in the art. The voltage regulator circuit 344 can be any known voltage regulator circuit such as, for example, a low dropout (LDO) regulator circuit or other suitable regulator circuit. The voltage regulator circuit 344 provides a precharge signal 347 in response to the bias signal 343.

In response to the enable signal 226, the first delay circuit 336 provides a voltage regulator enable signal 346, the second delay circuit 338 provides a capacitive element bypass signal 348, and the third delay circuit 340 provides an error detection enable signal 350. More specifically, the first delay circuit 366 provides the voltage regulator enable signal 346 after a first period of time, the second delay circuit 338 provides the capacitive element bypass signal 348 for a second period of time, and the third delay circuit 340 provides the error detection enable signal 350 after a third period of time. In some embodiments, the third period of time can be greater than the second period of time, which can be greater than the first period of time. In addition, the first, second, and third periods of time can be predetermined. For example, the first period of time can be 0.690 μs, the second period of time can be 3.75 μs, and the third period of time can be 4.25 μs, although other period of times are contemplated.

As such, when the lock loop circuit 216 is enabled, the switch circuits 330, 332 initially bypass the respective capacitive elements 326, 328 for the second period of time, which allows the steering signal 334 to rise quicker since the capacitors 326, 328 do not need to be charged and are not coupled to ground. After the second period of time, the bypass switch circuits 326, 328 are disabled allowing the floating ground loop filter circuit 302 to filter the unfiltered steering signal 322 to remove any imperfections.

The synchronized feedback divider circuit 308 includes a synchronization circuit 352 and a divider circuit 354. The synchronization circuit 352 provides the feedback frequency signal 318, which is based on the control signal 228, in response to the error detection enable signal 350 and the reference frequency signal 314. More specifically, the synchronization circuit 352 provides the feedback frequency signal 318 in response to the error detection enable signal 350 and after a desired edge of the reference frequency signal 314. In some embodiments, the desired edge can be a first rising edge of reference frequency signal 314 after the error detection enable signal 350 is provided.

The feedback frequency signal 318 is based on an initial feedback frequency signal 356. The divider circuit 354 provides the initial feedback frequency signal 356 by dividing (or in some cases multiplying) the output frequency signal 124 by a determined value such as 128 or other suitable value.

Figure 4:
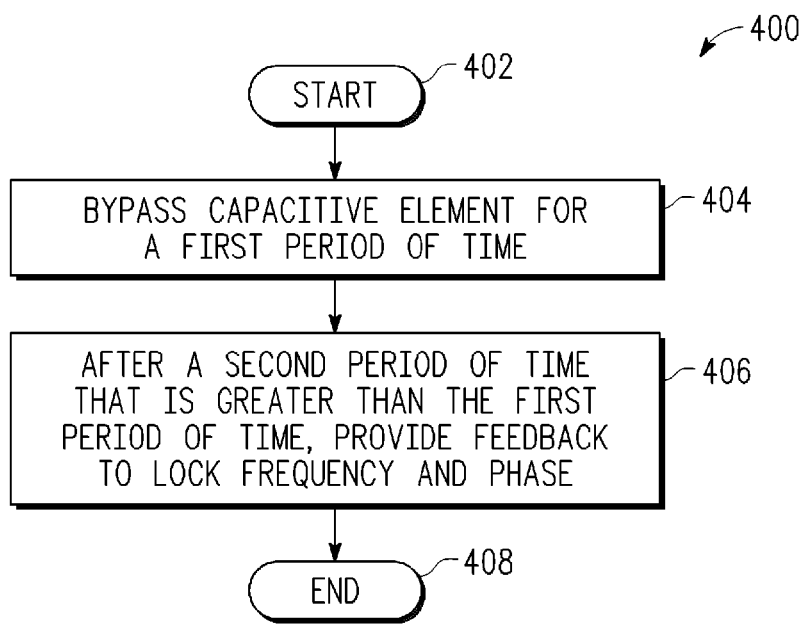
FIG. 4 is a flowchart depicting exemplary steps that can be taken by the reduced lock time lock loop circuit.

Referring now to FIG. 4, exemplary steps that can be taken by the lock loop circuit 216 to lock frequency and phase of the PWM control signal 228 to the reference frequency signal 314 are generally identified at 400. The process starts in step 402 when the lock loop enable signal 226 is received by the precharge circuit 304. In step 404, the floating ground loop filter circuit 302 controls the bypass switch circuits 330, 332 to bypass capacitive elements 326, 328, respectively, for the second period of time provided by the second delay circuit 338. After the third period of time provided by the third delay circuit 340, the synchronized feedback divider circuit 308 provides the feedback information 318 to the error detection circuit 300, which subsequently locks the frequency and phase of the control signal 228 to the reference frequency signal 314. In some embodiments, the feedback information is provided to the error detection circuit 300 after the third period of time and a rising edge (e.g., the first rising edge after the third period of time) of the reference frequency signal 314. The process ends in step 408.

Figure 5:
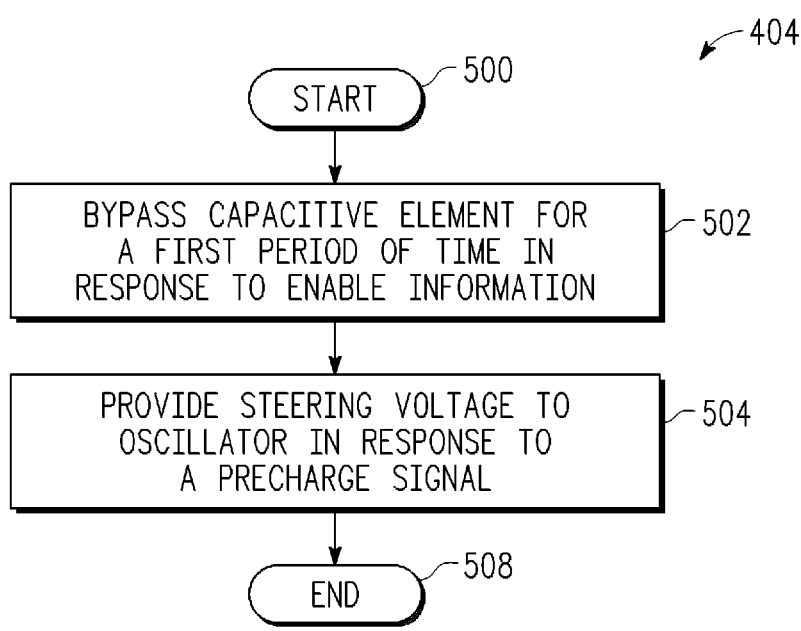
FIG. 5 is a flowchart depicting additional exemplary steps that can be taken by the reduced lock time lock loop circuit.

Referring to FIG. 5, exemplary steps that can be taken by the lock loop circuit 216 to bypass the capacitive elements 326, 328 of step 404 are generally identified. The process starts in step 500. In step 502, the precharge circuit 304 controls the bypass switch circuits 330, 332 of the floating ground loop filter circuit 302 to bypass the capacitive elements 326, 328 for the period of time provided by the second delay circuit 338 in response to the lock loop enable signal 226. As noted above, bypassing respective capacitive elements 326, 328 provides the steering signal 334 faster than known PLL circuits because the capacitive elements 326, 328 do not have to charge. In step 504, the floating ground loop filter circuit 302 provides the steering signal 334 to the controllable oscillator circuit 306 in response to the precharge signal 347. The controllable oscillator circuit 306 provides the control signal 228 in response to the steering signal 334. The process ends in step 508. If desired, the bypass switches 330, 332 can be controlled to discontinue bypassing the capacitive elements 326, 328 after the period of time provided by the second delay circuit 338 so that the floating ground loop filter 302 can filter the unfiltered signal 322.

Figure 6:
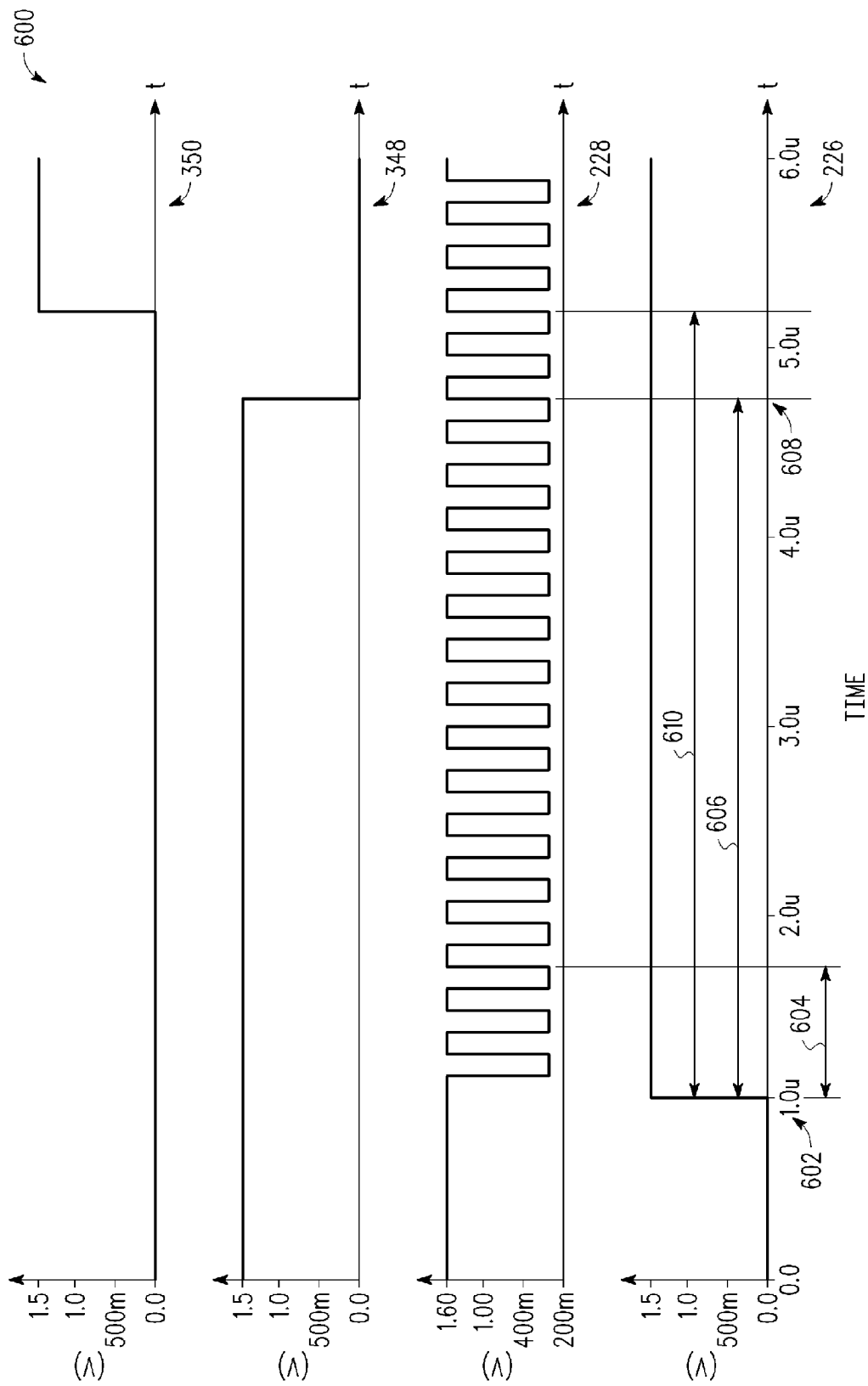
FIG. 6 is an exemplary timing diagram of various signals during operation of the reduced lock time lock loop circuit.

Referring now to FIG. 6, an exemplary timing diagram of the lock loop circuit 216 adjusting the frequency of the control signal 228 is generally identified at 600. At a first time 602, the precharge circuit 304 receives the lock loop enable signal 226. As shown, the capacitive element bypass signal 348 is provided in order to bypass the capacitive elements 326, 328 at start. During the first period of time 604, which is provided by the first delay circuit 336, the controllable oscillator 306 may provide some spurious frequencies in the control signal 228 due to voltage regulator circuit 344 settling time.

During the second period of time 606, which is provided by the second delay circuit 338, the frequency of the control signal 228 is adjusted faster than conventional PLL circuits 100 due to bypassing the capacitive elements 326, 328 and the floating ground nature of the floating ground loop filter circuit 302. At time 608, the precharge circuit 304 discontinues providing the capacitive element bypass signal 348, which disables the bypass switch circuits 330, 332 so that the floating ground loop filter circuit 302 can filter imperfections from the steering signal 334. After the third period of time 610, which is provided by the third delay circuit 340, the error detection enable signal 350 is provided to enable the error detection circuit 300 so that the frequency and phase of the control signal 228 can be locked to the reference frequency signal 314.

Figure 7:
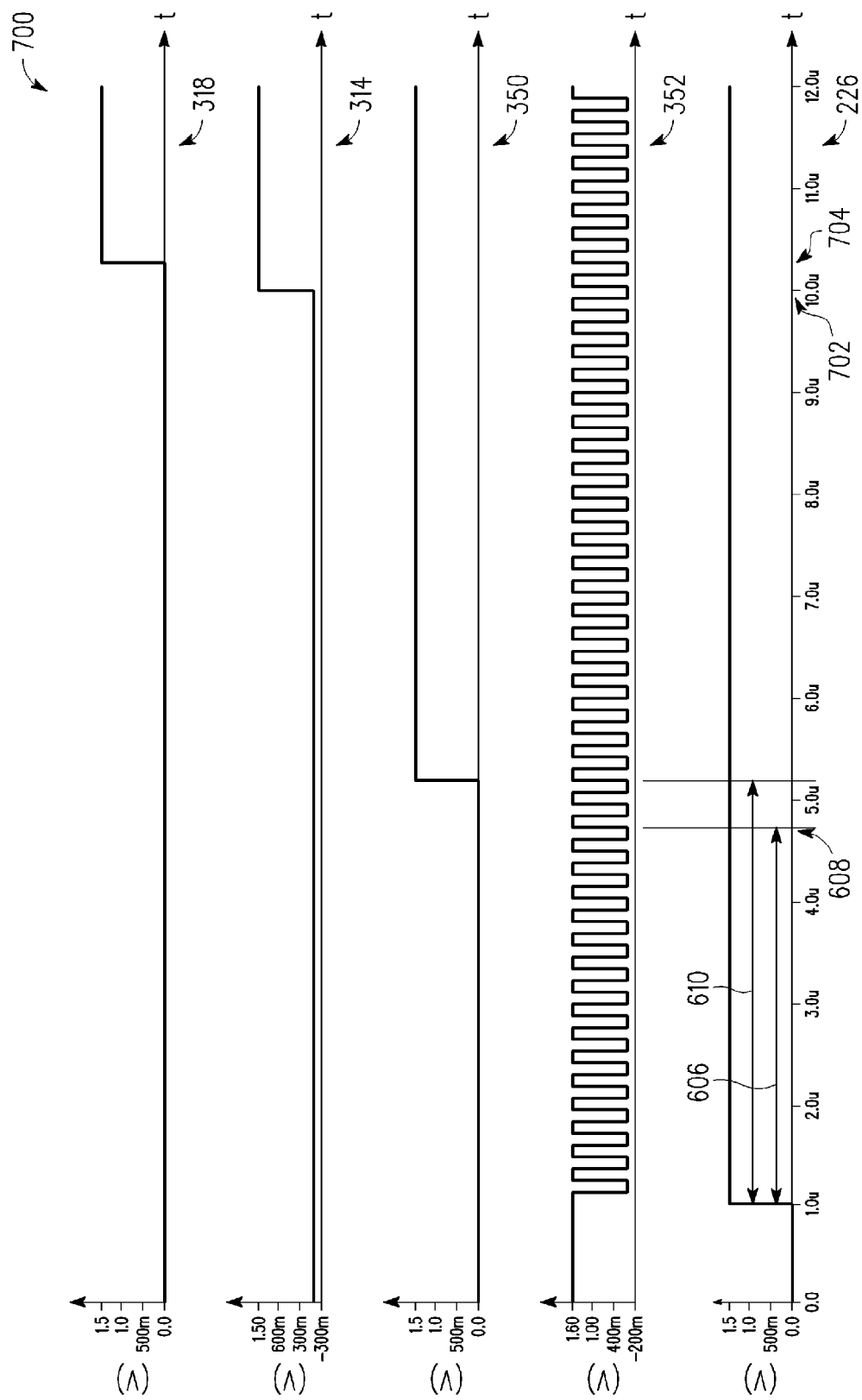
FIG. 7 is an additional exemplary timing diagram of various signals during operation of the reduced lock time lock loop circuit.

Referring now to FIG. 7, an exemplary timing diagram of the lock loop circuit 216 locking the frequency and phase of the control signal 228 is generally identified at 700. As shown, the precharge circuit 304 receives the lock loop enable signal 226 at time 602. During the second period of time 606, the frequency of the control signal 228 is adjusted while the capacitive elements 326, 328 are bypassed. At time 608, the precharge circuit 304 disables the bypass switch circuits 330, 332 so that the floating ground loop filter circuit 302 can filter imperfections from the steering signal 334. After the third period of time 610, the error detection enable signal 350 is provided to enable the error detection circuit 300. At time 702, a first rising edge of the reference frequency signal 314 is received by the error detection circuit 300. At time 704, a second rising edge of the control signal 228 is generated by the controllable oscillator 306 and the synchronized feedback divider circuit 308 provides the feedback frequency signal 318 to the error detection circuit so that the frequency and phase of the control signal 228 can be locked to the reference frequency signal 314.

As noted above, among other advantages, the reduced lock time lock loop circuit 216 provides an output signal having a frequency and phase that is locked to a reference signal faster than conventional PLL circuits. In addition, the floating loop ground filter 302 reduces leakage current to ground, which reduces power consumption and noise of the lock loop circuit 216. Other advantages will be recognized by those of ordinary skill in the art.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. In addition, unless stated otherwise, terms such as "first" and "second" are used to arbitrarily distinguish between the elements such terms describe. Thus, these terms are not necessarily intended to indicate temporal or other prioritization of such elements.

What is claimed is:

1. A lock loop circuit, comprising:
    a floating ground loop filter circuit, including at least one capacitive element, that is operative to provide a steering signal for a controllable oscillator circuit in response to a precharge signal; and
    a precharge circuit that is operative to provide the precharge signal and to control the floating ground loop filter to bypass the at least one capacitive element for a period of time in response lock loop enable information.

2. The lock loop circuit of claim 1 further comprising a synchronized feedback divider circuit that is operative to, provide, after the first period of time, feedback frequency information based on output frequency information to lock a phase and frequency of the output signal.

3. The lock loop circuit of claim 1 wherein the floating ground loop filter circuit further comprises at least one bypass switch circuit operatively coupled in parallel to the at least one capacitive element, wherein the at least one bypass switch circuit is operative to bypass the at least one capacitive element in response to a bypass control signal received from the precharge circuit.

4. The lock loop circuit of claim 1 wherein the floating ground loop filter circuit further comprises a plurality of bypass switch circuits operatively coupled in parallel to the at least one capacitive element and at least one additional capacitive element, wherein the plurality of bypass switch circuits are operative to bypass the at least one capacitive element and the at least one additional capacitive element in response to a bypass control signal received from the precharge circuit.

5. The lock loop circuit of claim 2 wherein the feedback frequency information is provided in response to a rising edge of reference frequency information.

6. The lock loop circuit of claim 2 further comprising an error detection circuit that is operative to provide an unfiltered steering signal based on the frequency feedback information and the reference frequency information.

7. The lock loop circuit of claim 2 wherein the precharge circuit comprises:
    a first delay circuit that is operative to provide a voltage regulator enable signal, after a third period of time that is less than the period of time, in response to the lock loop enable information;
    a second delay circuit that is operative to, in response the lock loop enable information, enable the floating ground loop filter to bypass the at least one capacitive element for the period of time;
    a third delay circuit that is operative to enable the synchronized feedback divider, after the second period of time, to provide the feedback frequency information; and
    a voltage regulator circuit that is operative to provide the precharge signal in response to the voltage regulator enable signal.

8. The lock loop circuit of claim 5 wherein the error detection circuit comprises:
    a phase-frequency detection circuit that is operative to provide error information based on a difference between the reference frequency information and the feedback frequency information; and
    a charge pump circuit that is operative to provide the unfiltered oscillator control signal in response to the error information.

9. A method of locking frequency and phase of an output signal to a reference signal, comprising:
    bypassing at least one capacitive element of a floating ground loop filter circuit for a first period of time in response to lock loop enable information; and
    providing, with the floating ground loop filter circuit, a steering signal for a controllable oscillator circuit in response to a precharge signal.

10. The method of claim 9 further comprising providing, after the first period of time, feedback frequency information based on output frequency information to lock a phase and frequency of the output signal.

11. The method of claim 10 comprising bypassing the at least one capacitive element in response to a bypass control signal and further comprising, after the first period of time, disabling the bypassing of the capacitive element in response to the bypass control signal and using the capacitive element to filter an unfiltered steering signal.

12. The method of claim 10 wherein the feedback frequency information is provided in response to a rising edge of reference frequency information.

13. The method of claim 12 further comprising providing an unfiltered steering signal based on the frequency feedback information and the reference frequency information.

14. The method of claim 10 further comprising:
   providing a voltage regulator enable signal, after a third period of time that is less than the period of time, in response to the lock loop enable information;
   enabling the floating ground loop filter circuit to bypass the at least one capacitive element for the period of time in response the lock loop enable information;
   enabling a synchronized feedback divider circuit, after the second period of time, to provide the feedback frequency information; and
   providing the precharge signal in response to the voltage regulator enable signal.

15. A mobile device, comprising:
   a battery supply circuit that is operative to provide a first voltage value;
   a switching converter circuit, including at least one switching element, that is operative to convert the first voltage value into a second voltage value; and
   a lock loop circuit that comprises:
      a controllable oscillator circuit that is operative to provide a switching control signal to the at least one switching element in response to a steering signal;
      a floating ground loop filter circuit, including at least one capacitive element, that is operative to provide the steering signal for the controllable oscillator circuit in response to a precharge signal; and
      a precharge circuit that is operative to provide the precharge signal and to control the floating ground loop filter circuit to bypass the at least one capacitive element for a period of time in response to lock loop enable information.

16. The mobile device of claim 15 wherein the lock loop circuit further comprises a synchronized feedback divider circuit that is operative to, after a second period of time, provide feedback frequency information based on the switching control signal, wherein the second period of time is greater than the period of time.

17. The mobile device of claim 15 further comprising at least one bypass switch circuit operatively coupled in parallel to the at least one capacitive element, wherein the at least one bypass switch circuit is operative to bypass the at least one capacitive element in response to a bypass control signal received from the precharge circuit.

18. The mobile device of claim 16 wherein the feedback frequency information is provided in response to a rising edge of reference frequency information.

19. The mobile device of claim 17 further comprising an error detection circuit that is operative to provide an unfiltered steering signal based on the frequency feedback information and the reference frequency information.

20. The mobile device of claim 19 wherein the error detection circuit comprises:
   a phase-frequency detection circuit that is operative to provide error information based on a difference between the reference frequency information and the feedback frequency information; and
   a charge pump circuit that is operative to provide the unfiltered oscillator control signal in response to the error information.

* * * * *